United States Patent
Liu et al.

(10) Patent No.: US 10,790,154 B2
(45) Date of Patent: Sep. 29, 2020

(54) METHOD OF LINE CUT BY MULTI-COLOR PATTERNING TECHNIQUE

(71) Applicant: Tokyo Electron Limited, Minato-ku, Tokyo (JP)

(72) Inventors: Eric Chih-Fang Liu, Albany, NY (US); Akiteru Ko, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/269,252

(22) Filed: Feb. 6, 2019

(65) Prior Publication Data
US 2019/0244826 A1 Aug. 8, 2019

Related U.S. Application Data

(60) Provisional application No. 62/627,572, filed on Feb. 7, 2018.

(51) Int. Cl.
| | | |
|---|---|---|
| H01L 21/00 | (2006.01) | |
| H01L 21/308 | (2006.01) | |
| H01L 21/67 | (2006.01) | |
| H01L 21/3065 | (2006.01) | |
| H01L 29/66 | (2006.01) | |
| H01L 21/8234 | (2006.01) | |
| H01L 27/092 | (2006.01) | |
| H01L 27/088 | (2006.01) | |
| H01L 29/78 | (2006.01) | |
| H01L 21/8238 | (2006.01) | |

(52) U.S. Cl.
CPC ...... *H01L 21/3081* (2013.01); *H01L 21/3065* (2013.01); *H01L 21/3086* (2013.01); *H01L 21/67069* (2013.01); *H01L 21/823431* (2013.01); *H01L 21/823821* (2013.01); *H01L 27/0886* (2013.01); *H01L 27/0924* (2013.01); *H01L 29/66545* (2013.01); *H01L 29/66795* (2013.01); *H01L 29/785* (2013.01)

(58) Field of Classification Search
CPC ......... H01L 29/66795; H01L 29/66545; H01L 29/785; H01L 27/0924; H01L 21/823431; H01L 21/823821; H01L 27/0886
See application file for complete search history.

(56) References Cited

U.S. PATENT DOCUMENTS

| | | | |
|---|---|---|---|
| 8,138,093 B2 * | 3/2012 | Akinmade-Yusuff | H01L 21/0335 257/622 |
| 8,822,343 B2 * | 9/2014 | Hsieh | G03F 7/70683 257/797 |
| 9,431,265 B2 * | 8/2016 | Cheng | H01L 21/3086 |

(Continued)

*Primary Examiner* — Nicholas J Tobergte
(74) *Attorney, Agent, or Firm* — Wood Herron & Evans LLP (57) ABSTRACT

Methods and systems for line cut by multi-color patterning techniques are presented. In an embodiment, a method may include providing a substrate. The method may also include forming a first feature on the substrate, the first feature having a cap formed of a first material. Additionally, the method may include forming a second feature on the substrate, the second feature having a cap formed of a second material. In still a further embodiment, the method may include selectively removing the second feature using an etch process that etches the first material at a first etch rate and etches the second material at a second etch rate, wherein the second etch rate is higher than the first etch rate.

21 Claims, 6 Drawing Sheets

(56) References Cited

U.S. PATENT DOCUMENTS

| | | | |
|---|---|---|---|
| 9,947,548 B2* | 4/2018 | Cheng | H01L 21/0337 |
| 9,978,608 B2* | 5/2018 | Xie | H01L 29/1037 |
| 10,269,576 B1* | 4/2019 | Huang | H01L 21/30604 |
| 2015/0194419 A1* | 7/2015 | Singh | H01L 29/41708 |
| | | | 257/173 |
| 2016/0093502 A1* | 3/2016 | Cheng | H01L 21/3086 |
| | | | 257/623 |
| 2019/0148159 A1* | 5/2019 | Huang | H01L 21/30604 |
| | | | 438/689 |

* cited by examiner

METHOD OF LINE CUT BY MULTI-COLOR PATTERNING TECHNIQUE

CROSS-REFERENCE TO RELATED APPLICATIONS

This application is related to and claims priority to U.S. Provisional Patent Application Ser. No. 62/627,572 filed on Feb. 7, 2018, the entire contents of which are herein incorporated by reference.

BACKGROUND OF THE INVENTION

Field of Invention

The present invention relates to systems and methods for substrate processing, and more particularly to line cut by multi-color patterning technique methods and systems.

Description of Related Art

Self-Aligned Multi-Patterning (SAMP) techniques have been used for formation of components of fin-type field effect transistor (FinFET) devices, and the like. Dimension shrinkage is a one of the driving force in the development of integrated circuit processing. By reducing the size dimensions, cost-benefit and device performance boosts can be obtained. This scalability creates inevitable complexity in process flow, especially on patterning techniques. SAMP techniques have been widely adapted in sub-30 nm FinFETs architecture, and it uses extra spacer etch steps to achieve pitch reduction requirements. Conventional SAMP flow has several steps, including core etch, spacer deposition, spacer etch and core pull. In this approach, the final feature critical dimension (CD) is controlled by spacer deposition thickness and spacer physical features, such as line edge roughness (LER) and line width roughness (LWR).

In some applications of SAMP techniques, certain lines may be edited. For example, FIGS. 1A-1E illustrates a process flow for a conventional line cut approach, where every third line is removed. With the conventional SAMP approaches, several defect issues occur during the line cut process, including damage to remaining lines or incomplete removal of lines intended to be cut. As shown in FIGS. 1A-1E, one reason for these defect issues at sub-30 nm regimes is that standard lithography processes may suffer from Edge Placement Error (EPE), such as misalignment of photoresist patterning with the underlying features.

Figure 1A:
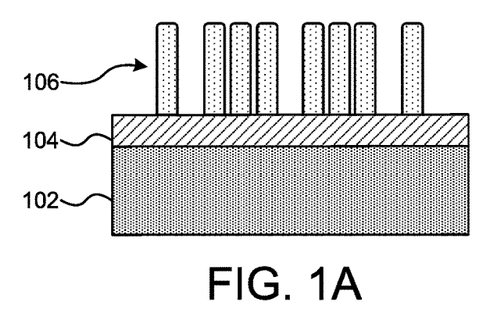
FIG. 1A is a schematic cross-section diagram illustrating an example of a work piece produced in a conventional line cut process according to the prior art.

FIG. 1A illustrates an example of a substrate received after a Self-Aligned Quadruple Patterning (SAQP) process. In such an example, the workpiece includes a substrate 102, which include material suitable for lithography process substrates, such as Si, GaAs, glass, etc. For the purposes of this example, the substrate 102 may be silicon. A hard mask layer 104 is formed on the substrate 102. Hard mask layers 104 may be oxides, nitrides, or the like. Spacers 106 are formed on the surface of the hard mask layer 104.

Figure 1B:
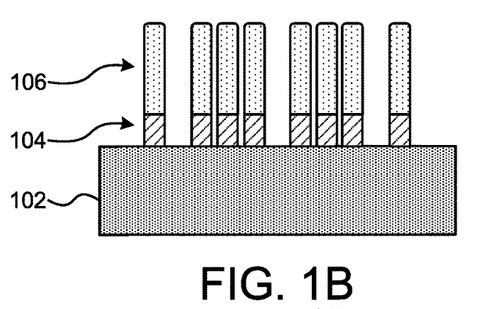
FIG. 1B is a schematic cross-section diagram illustrating an example of a work piece produced in a conventional line cut process according to the prior art.
Figure 1C:
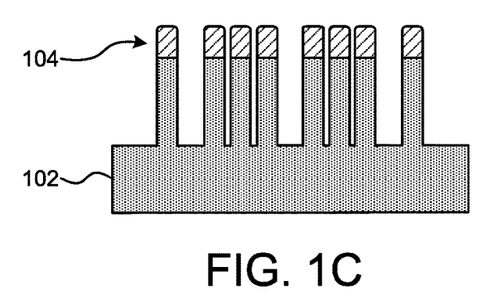
FIG. 1C is a schematic cross-section diagram illustrating an example of a work piece produced in a conventional line cut process according to the prior art.

At the step of FIG. 1B, the hard mask layer 104 may be etched using, for example, a Deep Reactive Ion Etch (DRIE) process, or the like. As a result of the hard mask etch process, the substrate 102 may be exposed. FIG. 1C illustrates a further etch process, where the substrate 102 is etched to form features in a pattern defined by the hard mask layer. During the substrate etch process, the spacers 106 may be removed.

Figure 1D:
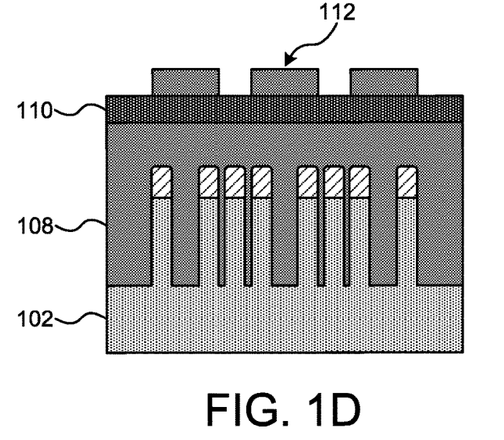
FIG. 1D is a schematic cross-section diagram illustrating an example of a work piece produced in a conventional line cut process according to the prior art.

At the step illustrated in FIG. 1D, the features may be filled with a filler 108 and a lithography stack may be formed thereon. For example, the filler may be an organic material, such as a spin-on-carbon (SOC) layer or a spin-on-glass (SOG) layer. The lithography stack may include the filler material 108, and an anti-reflective coating 110, such as SiARC, SiON, or the like. The lithography stack may also include a patterned layer 112, which may be formed of patternable materials such as photoresist.

Figure 1E:
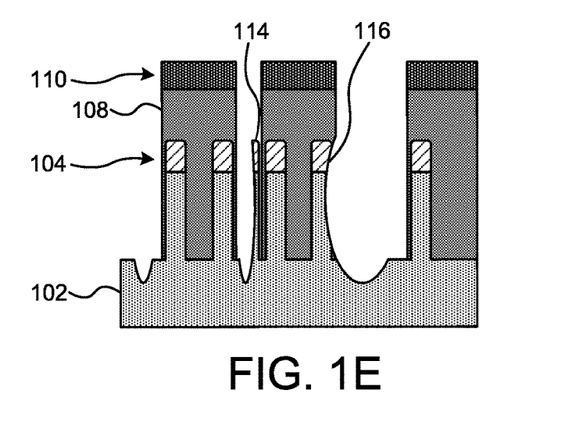
FIG. 1E is a schematic cross-section diagram illustrating an example of a work piece produced in a conventional line cut process according to the prior art.

The line cut process illustrated in FIG. 1E illustrates problems or issues associated with the conventional approach. As illustrated, EPE issues may cause misalignment of the line cut process with the underlying silicon features. For example, portions of certain features that are intended to be cut may be left remaining as shown at 114, and other features intended to remain may be damaged during the line cut process as shown at 116.

SUMMARY OF THE INVENTION

Methods and systems for line cut by multi-color patterning techniques are presented. In an embodiment, a method may include providing a substrate. The method may also include forming a first feature on the substrate, the first feature having a cap formed of a first material. Additionally, the method may include forming a second feature on the substrate, the second feature having a cap formed of a second material. In still a further embodiment, the method may include selectively removing the second feature using an etch process that etches the first material at a first etch rate and etches the second material at a second etch rate, wherein the second etch rate is higher than the first etch rate.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Methods and systems for line cut for self-aligned multi-patterning are described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

Figure 2:
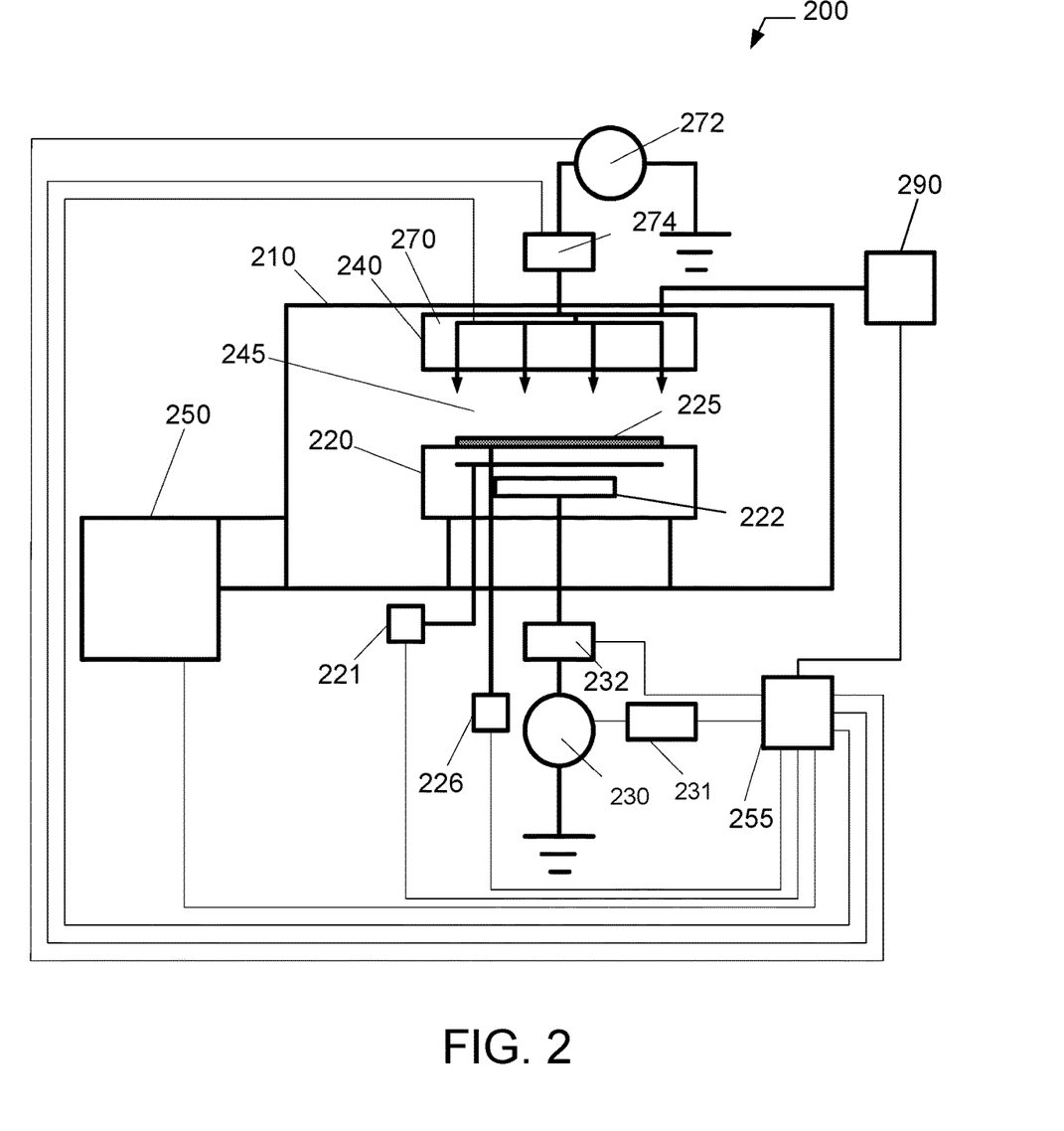
FIG. 2 is a schematic block diagram illustrating one embodiment of a plasma etch system configured for in-situ spacer reshaping for self-aligned multi-patterning methods and systems.

FIG. 2 is an embodiment of a system 200 for line cut for self-aligned multi-patterning. In a further embodiment, the system may be configured to perform in-situ spacer reshaping for self-aligned multi-patterning as described with reference to FIGS. 3-4K. An etch and post heat treatment system 200 configured to perform the above identified process conditions is depicted in FIG. 2 comprising a processing chamber 210, substrate holder 220, upon which a wafer 225 to be processed is affixed, and vacuum pumping system 250. The wafer 225 can be a semiconductor substrate, a wafer, a flat panel display, or a liquid crystal display. Processing chamber 210 can be configured to facilitate etching the processing region 245 in the vicinity of a surface of the wafer 225. An ionizable gas or mixture of process gases is introduced via a gas distribution system 240. For a given flow of process gas, the process pressure is adjusted using the vacuum pumping system 250.

The wafer 225 can be affixed to the substrate holder 220 via a clamping system (not shown), such as a mechanical clamping system or an electrical clamping system (e.g., an electrostatic clamping system). Furthermore, substrate holder 220 can include a heating system (not shown) or a cooling system (not shown) that is configured to adjust and/or control the temperature of substrate holder 220 and the wafer 225. The heating system or cooling system may comprise a re-circulating flow of heat transfer fluid that receives heat from substrate holder 220 and transfers heat to a heat exchanger system (not shown) when cooling, or transfers heat from the heat exchanger system to substrate holder 220 when heating. In other embodiments, heating/ cooling elements, such as resistive heating elements, or thermo-electric heaters/coolers can be included in the substrate holder 220, as well as the chamber wall of the processing chamber 210 and any other component within the processing system 200.

Additionally, a heat transfer gas can be delivered to the backside of wafer 225 via a backside gas supply system 226 in order to improve the gas-gap thermal conductance between wafer 225 and substrate holder 220. Such a system can be utilized when temperature control of the wafer 225 is required at elevated or reduced temperatures. For example, the backside gas supply system can comprise a two-zone gas distribution system, wherein the helium gas-gap pressure can be independently varied between the center and the edge of wafer 225.

In the embodiment shown in FIG. 2, substrate holder 220 can comprise an electrode 222 through which RF power is coupled to the processing region 245. For example, substrate holder 220 can be electrically biased at a RF voltage via the transmission of RF power from a RF generator 230 through an optional impedance match network 232 to substrate holder 220. The RF electrical bias can serve to heat electrons to form and maintain plasma. In this configuration, the system 200 can operate as a reactive ion etch (RIE) reactor, wherein the chamber and an upper gas injection electrode serve as ground surfaces.

Furthermore, the electrical bias of electrode 222 at a RF voltage may be pulsed using pulsed bias signal controller 231. The RF power output from the RF generator 230 may be pulsed between an off-state and an on-state, for example. Alternately, RF power is applied to the substrate holder electrode at multiple frequencies. Furthermore, impedance match network 232 can improve the transfer of RF power to plasma in plasma processing chamber 210 by reducing the reflected power. Match network topologies (e.g. L-type, π-type, T-type, etc.) and automatic control methods are well known to those skilled in the art.

Gas distribution system 240 may comprise a showerhead design for introducing a mixture of process gases. Alternatively, gas distribution system 240 may comprise a multi-zone showerhead design for introducing a mixture of process gases, and adjusting the distribution of the mixture of process gases above wafer 225. For example, the multi-zone showerhead design may be configured to adjust the process gas flow or composition to a substantially peripheral region above wafer 225 relative to the amount of process gas flow or composition to a substantially central region above wafer 225. In such an embodiment, gases may be dispensed in a suitable combination to form a highly uniform plasma within the chamber 210.

Vacuum pumping system 250 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 210.

In an embodiment, the source controller 255 can comprise a microprocessor, memory, and a digital I/O port capable of generating control voltages sufficient to communicate and activate inputs to processing system 200 as well as monitor outputs from plasma processing system 200. Moreover, source controller 255 can be coupled to and can exchange information with RF generator 230, pulsed bias signal controller 231, impedance match network 232, the gas distribution system 240, the gas supply 290, vacuum pumping system 250, as well as the substrate heating/cooling system (not shown), the backside gas supply system 226, and/or the electrostatic clamping system 221. For example, a program stored in the memory can be utilized to activate the inputs to the aforementioned components of processing system 200 according to a process recipe in order to perform a plasma assisted process, such as a plasma etch process or a post heating treatment process, on wafer 225.

In addition, the processing system 200 can further comprise an upper electrode 270 to which RF power can be coupled from RF generator 272 through optional impedance match network 274. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, source controller 255 is coupled to RF generator 272 and impedance match network 274 in order to control the application of RF power to upper electrode 270. The design and implementation of an upper electrode is well known to those skilled in the art. The upper electrode 270 and the gas distribution system 240 can be designed within the same chamber assembly, as shown. Alternatively, upper electrode 270 may comprise a multi-zone electrode design for adjusting the RF power distribution coupled to plasma above wafer 225. For example, the upper electrode 270 may be segmented into a center electrode and an edge electrode.

Depending on the applications, additional devices such as sensors or metrology devices can be coupled to the processing chamber 210 and to the source controller 255 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pulldown of structures (pulldown), slimming of structures (slimming), aspect ratio of structures (aspect ratio), line width roughness, substrate throughput, cost of ownership, and the like are achieved.

By modulating the applied power, typically through variation of the pulse frequency and duty ratio, it is possible to obtain markedly different plasma properties from those produced in continuous wave (CW). Consequently, RF power modulation of the electrodes can provide control over time-averaged ion flux and the ion energy.

Figure 3:
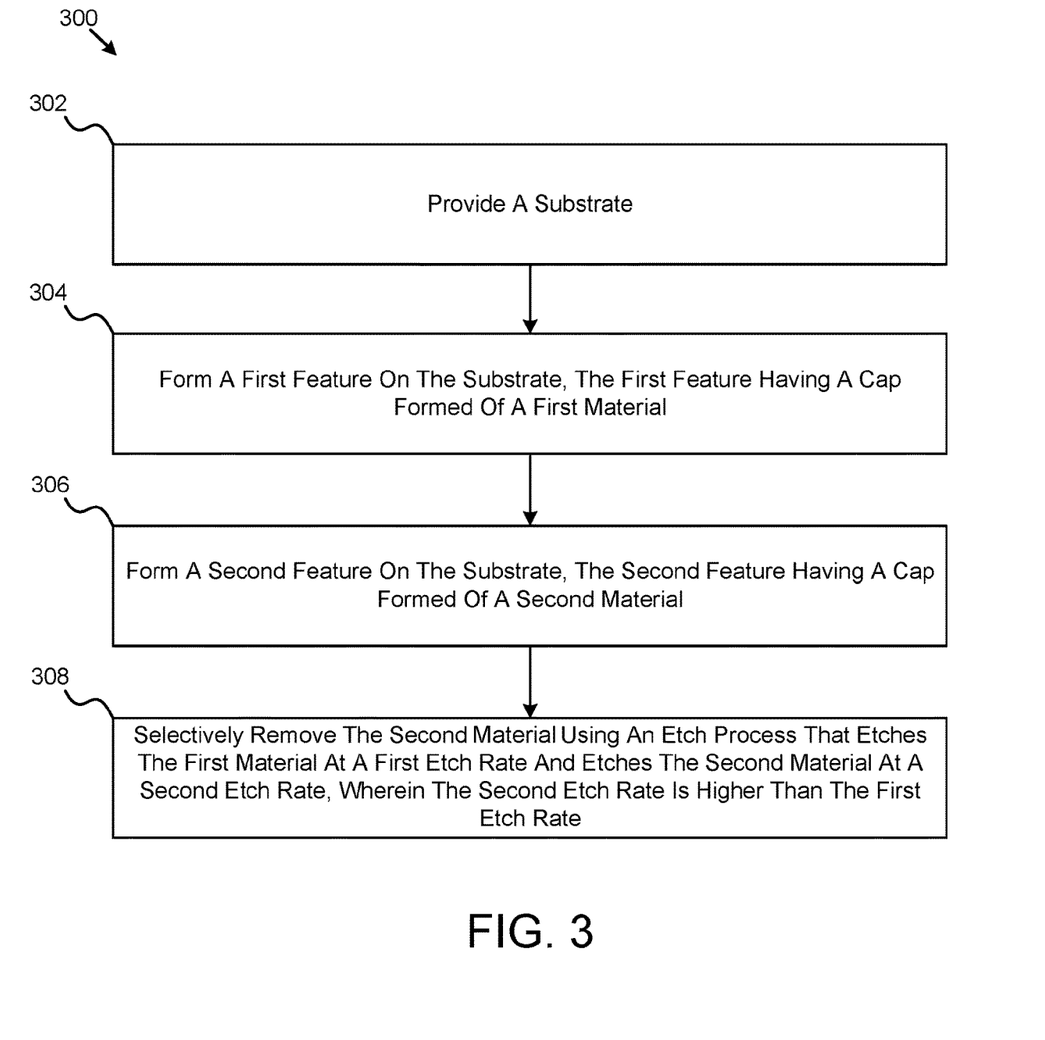
FIG. 3 is a schematic flowchart diagram illustrating one embodiment of a method for line cut by a multi-color patterning technique.

FIG. 3 illustrates one embodiment of a method 300 for line cut by multi-color patterning techniques. In an embodiment, the method 300 may include providing a substrate as shown at 302. The method 300 may also include forming a first feature in the substrate, the first feature having a cap formed of a first material as shown at 304. Additionally, the method 300 may include forming a second feature in the substrate, the second feature having a cap formed of a second material as shown at 306. The method 300 may also include selectively removing the second material using an etch process that etches the first material at a first etch rate and etches the second material at a second etch rate, wherein the second etch rate is higher than the first etch rate as shown at 308.

An embodiment of a process flow for implementing an embodiment of the method of FIG. 3 is illustrated in FIGS. 4A-4K. Each figure represents an example of a physical result that may be achieved by a processing step in the process flow. Such a process flow may be useful in manufacturing of semiconductor devices, such as MEMS devices. Each view is a cross-section diagram illustrating a portion of a workpiece which may be formed on, for example, the wafer 225.

Figure 4A:
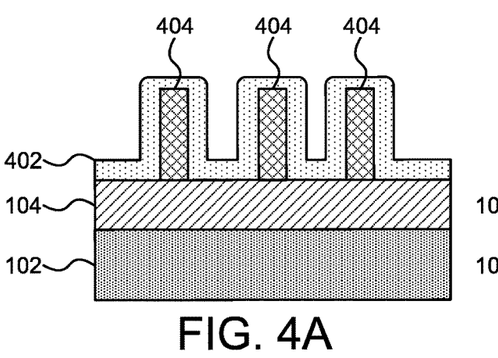
FIG. 4A is a schematic cross-section diagram illustrating one embodiment of a process for line cut by a multi-color patterning technique.

FIG. 4A illustrates an embodiment of a workpiece upon which the present embodiments may be utilized. The workpiece may include, for example, a substrate 102 and a hard mask layer 104. In an embodiment, one or more spacer core features 404 may be formed on the hard mask layer 104 and a first spacer material layer 402 may be formed over the spacer core features 404. In an embodiment, the first spacer material layer 402 may be a nitride material. Alternatively, the first spacer material layer 402 may be an oxide material.

Figure 4B:
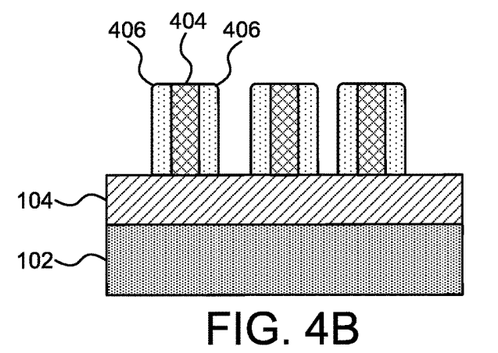
FIG. 4B is a schematic cross-section diagram illustrating one embodiment of a process for line cut by a multi-color patterning technique.

In the process step illustrated in FIG. 4B, the first spacer material layer 402 may be etched back to expose the spacer core features 404. As a result of such an etch process, one or more features 406 may be formed. In one embodiment, the one or more first features may be spacers surrounding the spacer core features 404. In various embodiments, the etch is performed using a plasma etch gas chemistry that may include one or more of $N_2$, $O_2$, CO, $CO_2$, $H_2$, HBr, $Cl_2$, $C_xH_y$, Ar, He, $C_xH_yF_z$, and $C_xF_y$, depending upon the material used for the first spacer material layer 402.

Figure 4C:
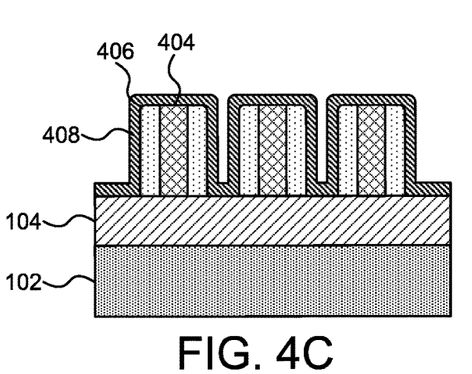
FIG. 4C is a schematic cross-section diagram illustrating one embodiment of a process for line cut by a multi-color patterning technique.

In the process step illustrated in FIG. 4C, a second spacer material layer 408 may be formed on the workpiece. The second spacer material layer 408 may be different from the first spacer material layer 402. More specifically, if the first spacer material layer 402 is an oxide material, then the second spacer material layer 408 may be a nitride material, such as TiN. Alternatively, if the first spacer material layer 402 is a nitride material, then the second spacer material layer 408 may be an oxide material. Regardless of the material chosen for the first spacer material layer 402, the material of the second spacer material layer 408 may be selectively etchable with respect to the first spacer material layer 402.

Figure 4D:
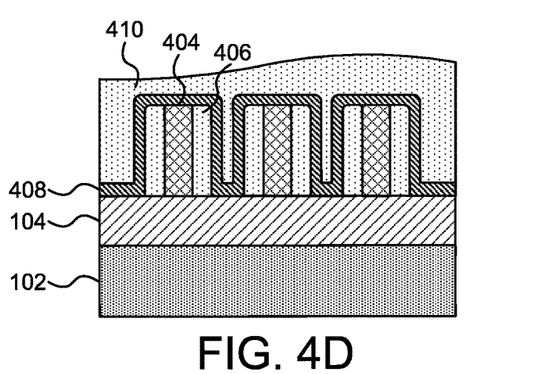
FIG. 4D is a schematic cross-section diagram illustrating one embodiment of a process for line cut by a multi-color patterning technique.
Figure 4E:
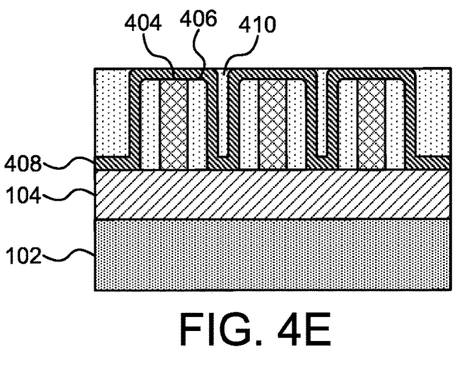
FIG. 4E is a schematic cross-section diagram illustrating one embodiment of a process for line cut by a multi-color patterning technique.
Figure 4F:
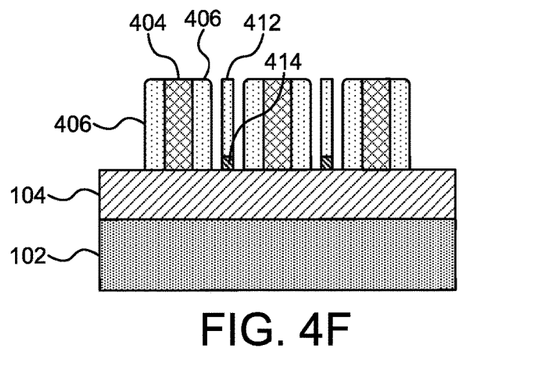
FIG. 4F is a schematic cross-section diagram illustrating one embodiment of a process for line cut by a multi-color patterning technique.

In the process step of FIG. 4D, a filler layer 410 may be deposited on the surface of the workpiece. In an embodiment, the filler layer 410 may be an oxide material. The filler layer 410 may be etched back at the step of FIG. 4E to a surface of the second spacer material layer 408. In an alternative layer, a portion of the filler layer 410 may be removed using, for example, a chemical mechanical polish (CMP) process. In the process step of FIG. 4F, a portion of the second spacer material layer 408 may be etched away to form the feature 412, a portion 414 of which may include the second spacer material layer 408 disposed adjacent the hard mask layer 104. In various embodiments, the etch is performed using a plasma etch gas chemistry that may include one or more of $N_2$, $O_2$, CO, $CO_2$, $H_2$, HBr, $Cl_2$, $C_xH_y$, Ar, He, $C_xH_yF_z$, and $C_xF_y$, depending upon the material used for the second spacer material layer 408.

Figure 4G:
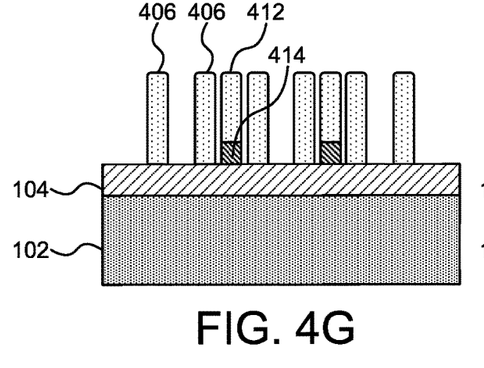
FIG. 4G is a schematic cross-section diagram illustrating one embodiment of a process for line cut by a multi-color patterning technique.

In the embodiment of FIG. 4G, the spacer core features 404 may be pulled. For example, in one embodiment, the spacer core features 404 may be formed of silicon, amorphous silicon, photoresist, or a combination thereof. The spacer cores may be pulled using an etch process that selectively etches the spacer core material.

Figure 4H:
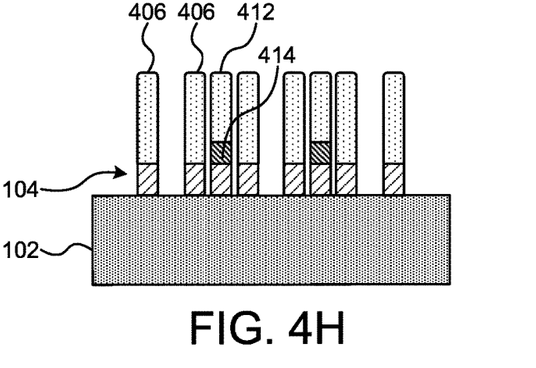
FIG. 4H is a schematic cross-section diagram illustrating one embodiment of a process for line cut by a multi-color patterning technique.
Figure 4I:
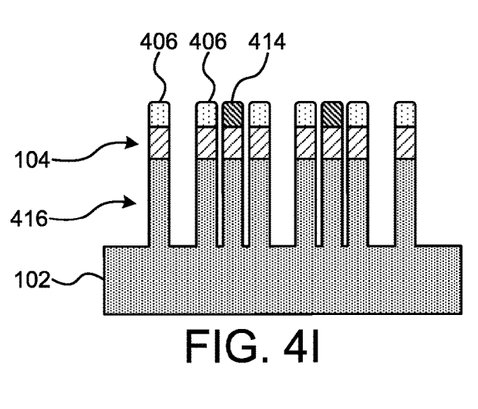
FIG. 4I is a schematic cross-section diagram illustrating one embodiment of a process for line cut by a multi-color patterning technique.

In the process of FIG. 4H, the hard mask layer 104 may be etched in a region left exposed by the features 406 and the features 412. In the process of FIG. 4I, the substrate 102 may be etched in a region exposed by the hard mask layer 104. According to such an embodiment, one or more features may be formed in at least a portion of the substrate 102.

Figure 4J:
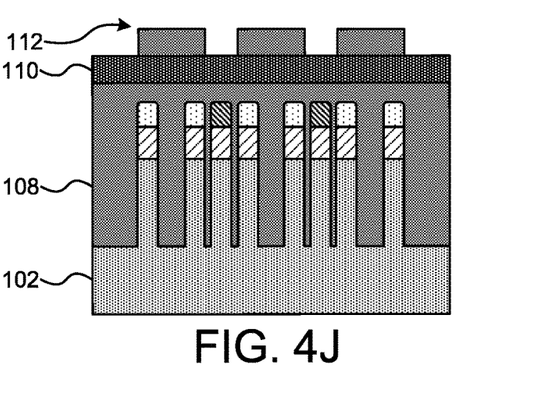
FIG. 4J is a schematic cross-section diagram illustrating one embodiment of a process for line cut by a multi-color patterning technique.

In the embodiment of FIG. 4J, the process includes forming a filler layer 108. In one embodiment, the filler layer 108 may be spin-on-organics, spin-on-carbon or spin-on-glass. An anti-reflective layer 110 may also be formed on the filler layer 108. A patterned layer 112 may also be formed on the anti-reflective layer 110. In one embodiment, the patterned layer 112 may include features having dimensions in the range of 30 nm to 60 nm. In an embodiment, the patterned layer 112 may leave an area proximate the feature 412 exposed.

Figure 4K:
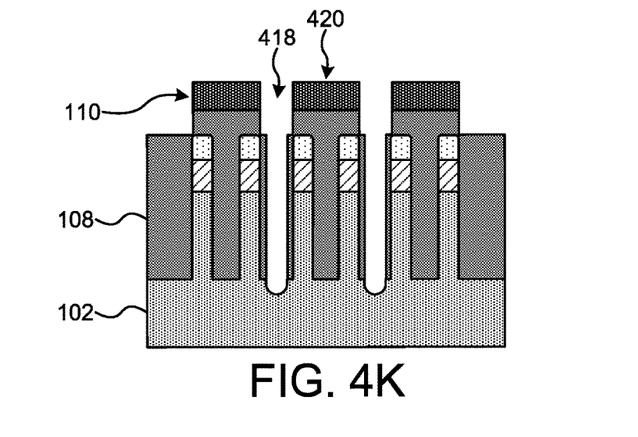
FIG. 4K is a schematic cross-section diagram illustrating one embodiment of a process for line cut by a multi-color patterning technique.

At the process step of FIG. 4K, a line feature of the substrate 102 may be pulled leaving a trench 418 between one or more remaining features 420. In such an embodiment, the etch chemistry used to form the trench 418 is configured to selectively etch the second spacer material layer 408, while etching the first spacer material layer 402 at a relatively slower rate, thereby preserving the features formed in the substrate under the first spacer material layer 402.

Flow rate ranges for various gasses described herein are listed in Table 1. All flow rates in Table 1 are measured in standard cubic centimeters per minute (sccm).

TABLE 1

Flow rate ranges for ion gasses.

| Gas | Range |
| --- | --- |
| $CHF_3$ | 14~250 sccm |
| $O_2$ | 3~390 sccm |
| Ar | 70~1400 sccm |
| $CH_3F$ | 4~90 sccm |
| $N_2$ | 15~300 sccm |
| $CH_4$ | 3~65 sccm |
| $SO_2$ | 12~250 sccm |
| HBr | 30~600 sccm |
| $CF_4$ | 10~400 sccm |

In an embodiment, the range of chamber pressures of gasses in Table 1 may be 3 mT~300 mT. In an embodiment, high frequency power produced by the RF generator 272 may be in the range of 0 W~1500 W, and low frequency power generated by the power supply 230 may be in the range of 0 W~1000 W. In an embodiment, the temperature within the chamber 230 may be in the range of −10 C~110 C.

Figure 5:
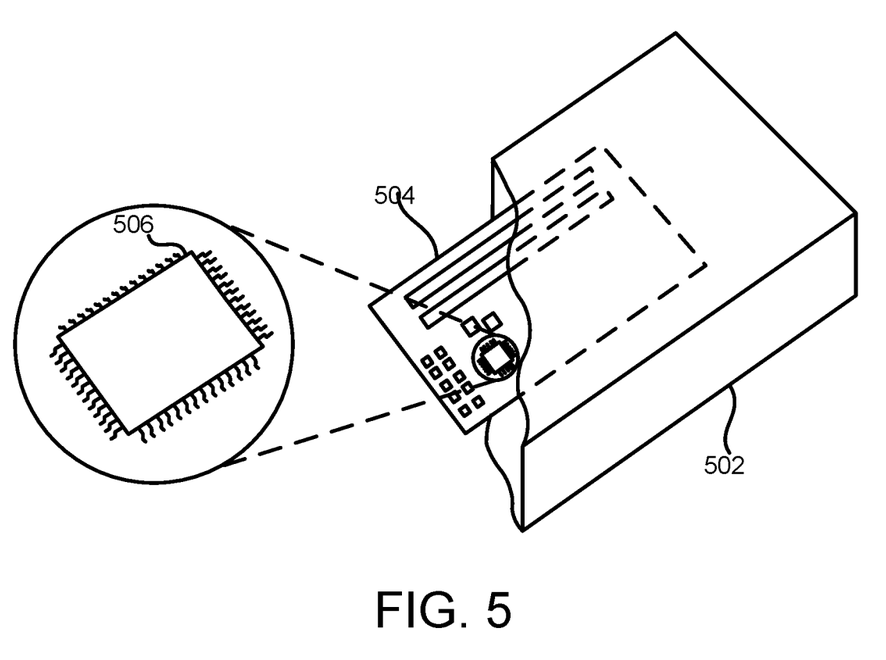
FIG. 5 is a cut-away view diagram illustrating one embodiment of a system having a device formed by a method for in-situ spacer reshaping for self-aligned multi-patterning.

The embodiments of the processes and methods described herein may be used in commercial processes for manufacturing semiconductor-based products for inclusion in commercial products. For example, FIG. 5 illustrates an electrical device 502 comprising a printed circuit board (PCB). The electrical device 502 may be one of several commercially available products, including for example, computers, computer monitors, televisions, audio amplifiers, cameras, smartphones and personal data assistants, tablet computing devices, smart watches, application-specific processing equipment, sensor devices, medical devices, etc. One of ordinary skill will recognize that devices manufactured according to the present embodiments are not limited to any particular field.

The electrical device 502 may include one or more PCBs 504, the PCBs 504 comprising one or more semiconductor-based electrical components, such as chip package 506. Chip package 506 may include a segmented chip of a wafer having one or more features, such as the FinFET device manufactured according to the processes described in FIGS. 3-4K disposed thereon. The chip may comprise, for example, a substrate 102. The chip may be packaged in a durable package for protection of the features disposed thereon. The chip package 506 may further include one or more contact pins configured to provide external access to certain contact points on the chip.

Advantageously, the size and density of the features disposed on the chip in chip package 506 may be small relative to devices manufactured with other techniques, because use of the passivation treatment and the spacer reshaping treatment allows for high resolution patterning of the semiconductor device, relative to previous methods.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method of substrate processing, the method comprising:
   providing a substrate;
   forming a core feature on the substrate;
   forming a spacer of a first material on the substrate surrounding and in contact with the core feature;
   forming a spacer material layer of a second material over each of the core feature and the spacer and a portion of the substrate;
   forming a second feature on the substrate spaced apart from the spacer, a portion of the second feature being of the second material; and
   selectively removing the second feature including the portion being of the second material using an etch process that etches the first material at a first etch rate and etches the second material at a second etch rate, wherein the second etch rate is higher than the first etch rate.

2. The method of claim 1, wherein the first material comprises an oxide material.

3. The method of claim 2, wherein the second material comprises a nitride material.

4. The method of claim 1, wherein prior to forming the core feature, the method further comprising forming a hard mask layer over the substrate.

5. The method of claim 4, wherein forming the core feature comprises forming a spacer mandrel on the hard mask layer.

6. The method of claim 5, wherein forming the spacer comprises forming a layer of the first material over the spacer mandrel and an exposed region of the hard mask layer.

7. The method of claim 6, wherein forming the spacer comprises etching back the first material to expose the hard mask layer and a surface of the spacer mandrel, leaving the spacer on the hard mask layer adjacent the spacer mandrel.

8. The method of claim 1, wherein forming the spacer material layer forms a recess and wherein forming the second feature comprises filling the recess with a second layer of the first material, the second feature being made of the first material formed on the second material.

9. The method of claim 8, further comprising removing a portion of the second layer of the first material to expose a surface of the spacer material layer over the spacer mandrel and the first spacer.

10. The method of claim 9, further comprising removing the spacer material layer to form the second feature, wherein removing the spacer material layer leaves the portion of the second material between the first material and the substrate.

11. The method of claim 10, further comprising removing the hard mask layer in one or more exposed regions between the first spacer and the second feature to expose a surface of the substrate.

12. The method of claim 11, further comprising removing a portion of the substrate in the region exposed between the first spacer and the second feature.

13. The method of claim 12, further comprising filling the removed portion of the substrate and a space between the spacer and the second feature with a third material.

14. The method of claim 13, further comprising forming an antireflective layer on a surface of the third material.

15. The method of claim 14, further comprising forming a patterned layer on a surface of the anti-reflective layer.

16. The method of claim 15, wherein selectively removing the second feature further comprises etching in a region of the antireflective layer left exposed by the patterned layer.

17. The method of claim 16, wherein etching the substrate is performed using a plasma etch gas chemistry comprising a plasma etch gas selected from the group consisting of $N_2$, $O_2$, CO, $CO_2$, $H_2$, HBr, $Cl_2$, $C_xH_y$, Ar, He, $C_xH_yF_z$, and $C_xF_y$, the selection being made to selectively etch the second spacer material and not etch the first spacer material.

18. A system for substrate processing, the method comprising:
   an ion etch chamber configured to:
   receive a substrate;
   form a core feature on the substrate;
   form a spacer of a first material on the substrate surrounding and in contact with the core feature;
      form a spacer material layer of a second material over each of the core feature and the spacer and a portion of the substrate;
      form a second feature on the substrate spaced apart from the spacer, a portion of the second feature being of the second material; and
      selectively remove the second feature including the portion being of the second material using an etch process that etches the first material at a first etch rate and etches the second material at a second etch rate, wherein the second etch rate is higher than the first etch rate.

19. The method of claim 1, wherein following forming the second feature, the method further includes removing the core feature from the substrate to leave the spacer spaced apart from the second feature on the substrate.

20. The method of claim 19, further comprising removing a portion of the substrate in the region exposed between the spacer and the second feature while leaving the portion of the second feature of the second material.

21. A method of substrate processing, the method comprising:
   providing a substrate;
   forming a first feature on the substrate, the first feature having a cap formed of a first material;
   forming a second feature on the substrate, the second feature having a cap formed of a second material; and
   selectively removing the second feature using an etch process that etches the first material at a first etch rate and etches the second material at a second etch rate, wherein the second etch rate is higher than the first etch rate, wherein forming the first feature comprises forming a spacer mandrel on the hard mask layer, forming the first feature comprises forming a layer of the first material over the mandrel and an exposed region of the hard mask layer, forming the first feature comprises etching back the first material to expose the hard mask layer and a surface of the spacer mandrel, leaving a first spacer on the hard mask layer adjacent the spacer mandrel, forming the second feature comprises forming a layer of the second material over the spacer mandrel, the first spacer, and the hard mask layer, and forming the second feature comprises filling recesses left over the layer of the second material with a second layer of the first material.

* * * * *

UNITED STATES PATENT AND TRADEMARK OFFICE
CERTIFICATE OF CORRECTION

PATENT NO. : 10,790,154 B2
APPLICATION NO. : 16/269252
DATED : September 29, 2020
INVENTOR(S) : Eric Chih-Fang Liu et al.

Page 1 of 1

It is certified that error appears in the above-identified patent and that said Letters Patent is hereby corrected as shown below:

In the Specification

Column 1, Line 39, "For example, FIGS. 1A-1E illustrates a" should be --For example, FIGS. 1A-1E illustrate a--.

Column 1, Line 52, "which include material" should be --which includes material--.

Column 8, Lines 49-51, "generated by the power supply 230 may be in the range of .... In an embodiment, the temperature within the chamber 230 may" should be --generated by the power supply 230 may be in the range of .... In an embodiment, the temperature within the chamber 210 may--.

In the Claims

Column 10, Line 11, Claim 11, "the first spacer and the second feature to expose a surface of" should be --the spacer and the second feature to expose a surface of--.

Column 10, Lines 14-15, Claim 12, "a portion of the substrate in the region exposed between the first spacer and the second feature." should be --a portion of the substrate in the region exposed between the spacer and the second feature.--.

Signed and Sealed this
Twelfth Day of January, 2021

Andrei Iancu
*Director of the United States Patent and Trademark Office*